United States Patent [19]
Suzuki et al.

[11] Patent Number: 6,054,383
[45] Date of Patent: Apr. 25, 2000

[54] FABRICATION METHOD OF SEMICONDUCTOR DEVICE

[75] Inventors: Mieko Suzuki; Tetsuya Homma, both of Tokyo, Japan

[73] Assignee: NEC Corporation, Tokyo, Japan

[21] Appl. No.: 08/754,327

[22] Filed: Nov. 21, 1996

[30] Foreign Application Priority Data

Nov. 21, 1995 [JP] Japan ..................................... 7-302752

[51] Int. Cl.[7] .............................................. H01L 21/4763
[52] U.S. Cl. ........................... 438/633; 438/692; 438/640
[58] Field of Search .................................... 438/633, 637, 438/638, 640, 700, 692

[56] References Cited

U.S. PATENT DOCUMENTS

| | | |
|---|---|---|
| 5,244,534 | 9/1993 | Yu et al. . |
| 5,403,779 | 4/1995 | Joshi et al. . |
| 5,618,381 | 4/1997 | Doan et al. . |
| 5,658,830 | 8/1997 | Jeng ......................................... 438/620 |

FOREIGN PATENT DOCUMENTS

| | | |
|---|---|---|
| 2-177427 | 7/1990 | Japan . |
| 4-65129 | 3/1992 | Japan . |
| 4264728 | 9/1992 | Japan . |

*Primary Examiner*—Caridad Everhart
*Attorney, Agent, or Firm*—Sughrue, Mion, Zinn, Macpeak & Seas, PLLC

[57] ABSTRACT

A fabrication method of a semiconductor device is provided, which enables the formation of a conductive plug in an opening of an interlevel dielectric layer without arising any void. After a first wiring layer is formed on a first interlevel electric layer, a second interlevel dielectric layer is formed on the first interlevel dielectric layer to cover the first wiring layer. A first opening is formed in the second interlevel dielectric layer. A first conductive layer is formed on or over the second interlevel dielectric layer to cover the first opening. A first protection layer is formed on the first conductive layer to cover a first depressed part of the first conductive layer. The first protection layer having a first buried part on the first depressed part. The first protection layer and the first conductive layer are polished by a CMP process until the second interlevel dielectric layer is exposed, thereby selectively leaving the first depressed part within the first opening. The first depressed part left within the first opening constitutes a first conductor plug for electrically interconnecting the first wiring layer with a second wiring layer formed to be contacted with the fist conductor plug.

11 Claims, 5 Drawing Sheets

FABRICATION METHOD OF SEMICONDUCTOR DEVICE

BACKGROUND OF THE INVENTION

1. Field of the Invention

The present invention relates to a fabrication method of a semiconductor device and more particularly, to a fabrication method of a semiconductor device in which a conductor plug is formed in an opening of an interlevel dielectric layer for interconnecting upper- and lower-level wiring layers in a semiconductor integrated circuit.

2. Description of the Prior Art

A conventional fabrication method of a semiconductor device of this sort is shown in FIGS. 1A and 1B, which is disclosed in the Japanese Non-Examined Patent Publication No. 4-167448 published in June 1992 and 5-275866 published in October 1993.

First, a first interlevel dielectric layer 102 is formed on a semiconductor substructure 101 having active elements therein. The semiconductor substructure 101 typically includes a semiconductor substrate, a patterned insulating layer formed on or over a main surface of the substrate, and a patterned conductive layer formed on the insulating layer.

Next, a metal layer is formed on the first interlevel dielectric layer 102 to be patterned, thereby forming a first wiring layer 103. The first interlevel dielectric layer 102 serves to electrically insulate the first wiring layer 103 from the underlying conductive layer of the substructure 101.

Further, a silicon dioxide ($SiO_2$) layer serving as a second interlevel dielectric layer 104 is deposited on the first interlevel dielectric layer 102 to cover the first wiring layer 103 by a Plasma-Enhanced Chemical Vapor Deposition (PECVD) process. Then, a contact hole 122 is formed in the second interlevel dielectric layer 104 by popular lithography and etching processes. The contact hole 122 is formed to expose the top of the underlying first wiring layer 103.

Subsequently, a blanket tungsten (W) layer 121 is selectively deposited on the second interlevel dielectric layer 104 to cover the contact hole 122 by a Low-Pressure CVI (LPCVD) process, thereby filling the contact hole 122 with the W layer 121. A part of the W layer 121 is located on the surface of the dielectric layer 104 outside the hole 122. The W layer 121 is contacted with the top of the first wiring layer 103 and the inside wall of the layer 104 within the hole 122.

To planarize the surface of the W layer 121, the excess W layer 121 on the surface of the second interlevel dielectric layer 104 is removed by a Chemical/Mechanical Polishing (CMP) process until the surface of the layer 104 is exposed. At the end of this CMP process, the W layer 122 is selectively left inside the contact hole 122. The state at this stage is shown in FIG. 1A. The remaining W layer within the hole 122 serves as a conductor plug.

The above CMP process for the W layer 121 is performed by the use of a polishing slurry containing abrasive particles such as alumina ($Al_2O_3$) particles and an oxidizing agent such as hydrogen peroxide ($H_2O_2$). The surface area of the second interlevel dielectric layer 104 also is slightly etched during the CMP process.

Finally, a metal layer is formed on the planarized surfaces of the second interlevel dielectric layer 104 and the W layer 121, and is then patterned, thereby forming a second wiring layer 116. The state at this stage is shown in FIG. 1B. As shown in FIG. 1B, the second wiring layer 116 is contacted with the conductor plug made of the remaining W layer 121 within the contact hole 122.

Thus, the second wiring layer 116 in an upper level is electrically interconnected with the first wiring layer 103 in a lower level through the plug 121, thereby forming a two-level wiring structure over the semiconductor substructure 101.

With the conventional fabrication method shown in FIGS. 1A and 1B, the following problem occurs.

Specifically, as shown in FIG. 1A, a void 123 tends to be formed within the contact hole 122 at the end of the CMP process and/or the thickness of the remaining W layer 121 within the hole 122 tends to be decreased. The void 123 is caused by the fact that the W layer 121 has a depression at a corresponding position to the contact hole 122 according to the configuration of the hole 122. Since the polishing slurry contains the oxidizing agent for the W layer 121, the W layer 122 tends to be readily etched in the vicinity of the depression during the CHP process, resulting in the void 123 within the contact hole 122, as shown in FIG. 1A.

Also, when the W layer 121 has the void 123 within the contact hole 122, the W layer 122 is readily etched vertically and laterally by the oxidizing agent in the vicinity of the void 123. Thus, the thickness of the W layer 121 inside the hole 122 decreases during the CMP process.

Further, the above problem relating to the void 123 causes another problem that the fabrication yield and reliability of a semiconductor integrated circuit fabricated by the above conventional method is remarkably degraded.

SUMMARY OF THE INVENTION

Accordingly, an object of the present invention is to provide a fabrication method of a semiconductor device which makes it possible to form a conductive plug in an opening of an interlevel dielectric layer without arising any void through a CMP process for planarizing the conductor plug with the use of a polishing material including an oxidizing agent.

Another object of the present invention is to provide a fabrication method of a semiconductor device which is able to ensure high fabrication yield and high reliability of a semiconductor device fabricated by the method.

The above objects together with others not specifically mentioned will become clear to those skilled in the art from the following description.

A fabrication method of a semiconductor device according to the present invention includes the following steps.

After a first interlevel dielectric layer is formed on a semiconductor substructure, a first wiring layer is formed on the first interlevel dielectric layer. A second interlevel dielectric layer is formed on the first interlevel dielectric layer to cover the first wiring layer.

Then, a first opening is formed in the second interlevel dielectric layer to expose the top of the first wiring layer. A first conductive layer is formed on or over the second interlevel dielectric layer to cover the first opening. The first conductive layer has a first depressed part located in the first opening according to the configuration of the first opening.

A first protection layer is formed on the first conductive layer to cover the first depressed part of the first conductive layer. The first protection layer has a first buried part located on the first depressed part of the first conductive layer.

The first protection layer and the first conductive layer are polished by a CMP process with the use of a polishing material including an oxidizing agent of said first conductive layer until the second interlevel dielectric layer is exposed, thereby selectively leaving said first depressed part of the first conductive layer within the first opening.

The first depressed part left within the first opening constitutes a first conductor plug for electrically interconnecting the first wiring layer with a second wiring layer which will be formed to be contacted with the fist conductor plug.

With the fabrication method according to the present invention, the first conductive layer is covered with the first protection layer and then, the first conductive layer and the first protection layer are polished by the CMP process with the use of the polishing material including the oxidizing agent.

Also, the first protection layer has the first buried part left on the remaining first depressed part of the first conductive layer within the first opening.

Therefore, due to the presence of the first buried part of the first protection layer during the CMP process, the first depressed part of the first conductive layer is effectively prevented from being chemically etched by the oxidizing agent. This means that no void is generated in the remaining first depressed part of the first conductive layer and accordingly, the thickness of the first depressed part is not decreased.

As a result, the semiconductor device with high reliability is able to be fabricated at a high fabrication yield.

In a preferred embodiment of the present invention, the step of forming a second wiring layer on the second interlevel dielectric layer to cover the first opening is added. The second wiring layer is electrically interconnected with the first wiring layer through the first conductor plug.

In another preferred embodiment of the present invention, the step of forming a plurality of openings in the second interlevel dielectric layer is added. The first opening has a minimum diameter among the first opening and the plurality of openings. The first conductive layer has a thickness equal to (⅕) to (⅔) of the minimum size of the first opening. If the thickness of the first conductive layer is less than (⅕) of the minimum size of the first opening, the first conductive layer does not provide a satisfactory function of the conductor plug. If the thickness of the first conductive layer is greater than (⅔) of the minimum size of the first opening, the first protection layer is not buried on the depressed part of the first conductive layer, and as a result, it does not provide a satisfactory protection function.

Preferably, the first conductive layer is made of at least one selected from the group consisting of tungsten, aluminum, aluminum alloy, and copper. The first conductive layer is formed by at least one selected from the group consisting of chemical vapor deposition, chemical evaporation, and sputtering.

Preferably, the first protection layer is made of at least one selected from the group consisting of titanium nitride, titanium, silicon, silicon dioxide produced by plasma-enhanced CVD, silicon nitride produced by plasma-enhanced CVD, and silicon oxynitride produced by plasma-enhanced CVD.

The thickness of the first protection layer is preferably 0.05 $\mu$m to 0.2 $\mu$m. If it is greater than 0.2 $\mu$m, the necessary time for the polishing process is too long. If it is less than 0.05 $\mu$m. the first protection layer does not provide a satisfactory protection function.

Preferably, the CMP process is performed by the use of a slurry including an abrasive material and an oxidizing agent for the first conductive layer. The abrasive material preferably includes abrasive particles made of at least one selected from the group consisting of silica, alumina, cerium, and silicon oxynitride.

In still another preferred embodiment of the present invention, the step of forming a first barrier layer on the second interlevel dielectric layer to cover the first opening is added. The first conductive layer is formed on the first barrier layer.

In a further preferred embodiment of the present invention, the first opening includes a lower part serving as a via hole and an upper part serving as a wiring trench communicated with the via hole.

In a still further preferred embodiment of the present invention, a second opening is additionally formed in the second interlevel dielectric layer to expose the top of the first wiring layer at a different location from that of the first opening in the step (e). The second opening has a larger size than that of the first opening. The following steps are further added.

A second conductive layer is formed on the first protection layer after the step (g). The second conductive layer has a second depressed part located in the second opening according to the configuration of the second opening. A second protection layer is formed on the second conductive layer. The second protection layer has a second buried part located on the second depressed part of the second conductive layer.

The second protection layer, the second conductive layer, the first protection layer, and the first conductive layer are polished in the step (h), thereby selectively leaving the second depressed part of the second conductive layer and the second buried part of the second protection layer within the second opening.

The second depressed part of the second conductive layer and the second buried part of the second protection layer left within the second opening constitute a second conductor plug for electrically interconnecting the first wiring layer with the second wiring layer.

The thickness of the second protection layer is preferably 0.05 $\mu$m to 0.2 $\mu$m. If it is greater than 0.2 $\mu$m, the necessary time for the polishing process is too long. If it is less than 0.05 $\mu$m, the second protection layer does not provide a satisfactory protection function. This is the same as that of the first protection layer.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1A:
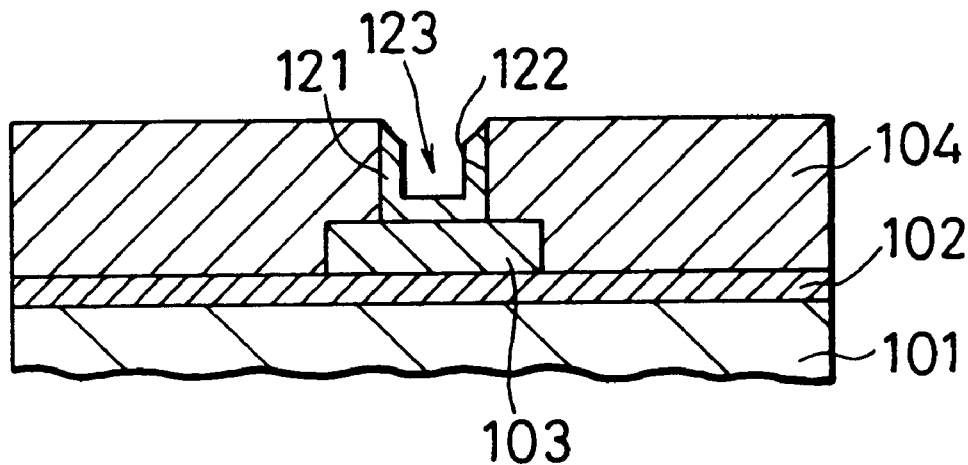
FIGS. 1A and 1B are partial cross-sectional views showing the process steps of a conventional fabrication method of a semiconductor device, respectively.
Figure 1B:
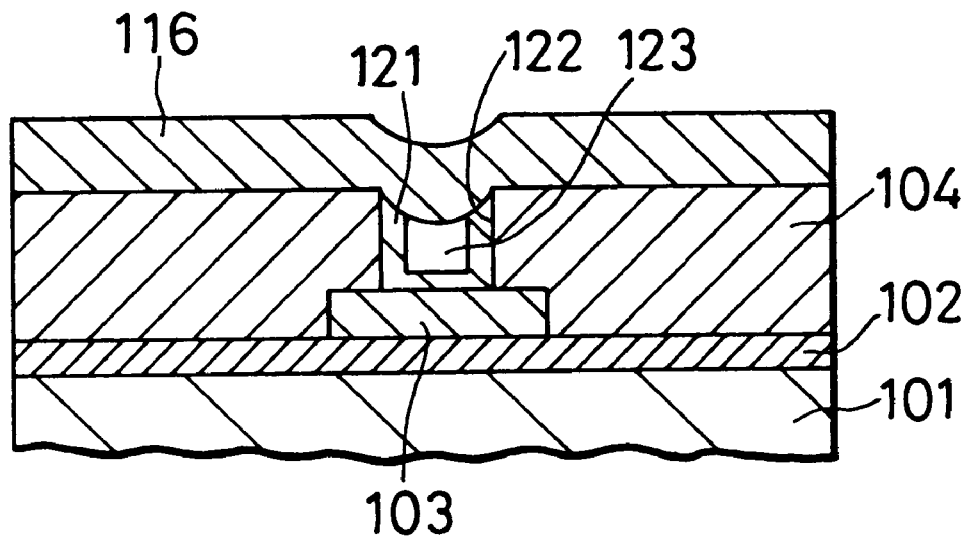

Preferred embodiments of the present invention will be described in detail below while referring to the drawings attached.

First Embodiment

A fabrication method of a semiconductor device according to a first embodiment is shown in FIGS. 2A to 2D.

First, a semiconductor substructure 1 is prepared. This substructure 1 typically includes a semiconductor substrate, an insulating layer formed on a main surface of the substrate, and a patterned conductive layer formed on or over the main surface of the substrate. A plurality of active elements (not shown) are formed in the substructure 1.

Next, a first interlevel dielectric layer 2 is formed on a main surface of the substructure 1 by a CVD process. A first wiring layer 3 made of a metal layer with a thickness of 0.5 $\mu$m is formed on the dielectric layer 2. The thickness of the layer 2 may be 0.3 $\mu$m to 1.0 $\mu$m.

Then, a second interlevel dielectric layer 4 with a thickness of 0.8 $\mu$m is formed on the first interlevel dielectric layer 2 to cover the first wiring layer 3 by a CVD process. The thickness of the layer 4 may be 0.5 $\mu$m to 1.0 $\mu$m.

Figure 2A:
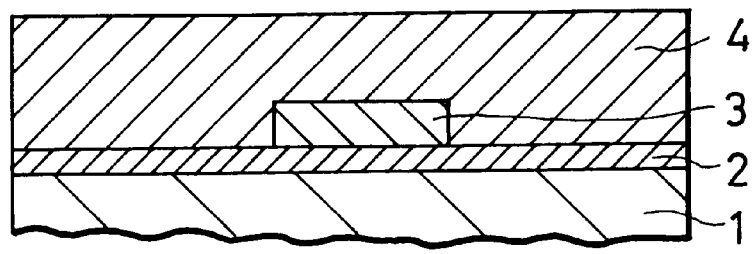
FIGS. 2A to 2D are partial cross-sectional views showing the process step of a fabrication method of a semiconductor device according to a first embodiment of the invention, respectively.

To planarize the surface of the second interlevel dielectric layer 4, the layer 4 is subjected to a popular CMP process. The state at this stage is shown in FIG. 2A.

Following this, a plurality of via holes are formed in the second interlevel dielectric layer 4 by a popular lithography and etching processes to expose the top of the lower wiring layer 3 at different locations. However, only one hole 5 is shown here for the sake of simplification of description.

A barrier layer 7 is formed on the second interlevel dielectric layer 4. The barrier layer 7 is contacted with the surface of the dielectric layer 4 outside the via hole 5, and is contacted with the top of the first wiring layer 3 and with the side wall of the layer 4 inside the via hole 5.

The barrier layer 7 has a two-layer structure made of a lower Ti sublayer with a thickness of 0.1 $\mu$m and an upper TiN sublayer with a thickness of 0.06 $\mu$m. These two sublayers are produced by sputtering processes, respectively. The total thickness of the layer 7 is 0.16 $\mu$m.

The thickness of the TiN sublayer may be 0.05 $\mu$m to 0.15 $\mu$m. The thickness of the Ti sublayer may be 0.02 $\mu$m to 0.08 $\mu$m.

A blanket W layer 8 is formed on the barrier layer 7 by a CVD process. The W layer 8 has a thickness equal to (⅓) of the diameter of the via hole 5. If the plurality of via holes are different in size, the thickness of the W layer B is set to be equal to (⅓) of the minimum diameter of the holes.

The thickness of the w layer a may be set to be equal to (⅕) to (⅔) of the diameter of the (minimum) via hole 5. If it is less than (⅕) of the diameter of the via hole 5, no satisfactory action as a contact region is obtained. If it is greater than (⅔) of the diameter of the via hole 5, the buried part 10a of the protection layer 10 is not formed in the via hole 5.

Figure 2B:
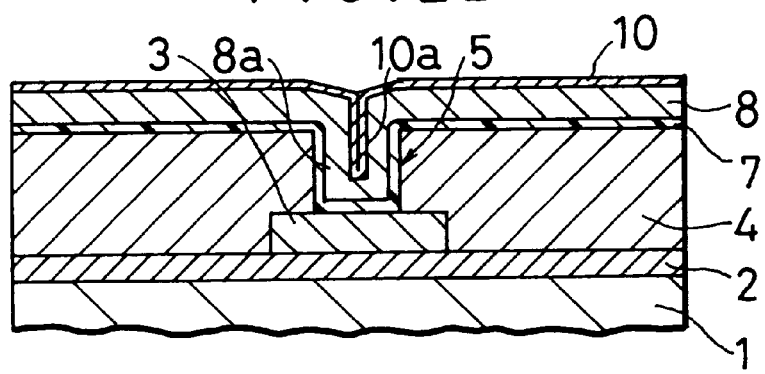

As shown in FIG. 2B, the W layer 8 has a depressed part 8a in the hole 5. The part 8a has a cross section like a U character according to the configuration of the hole 5.

The thickness of the W layer a is determined so that the entire hole 5 is not filled with the layer 8. In other words, it is determined so that a depression is formed on the layer 8 within the via hole 5.

Subsequently, a protection layer 10 made of a TiN layer with a thickness of 0.1 $\mu$m is formed on the blanket W layer 8 by a CVD process. Since the depression is formed on the W layer 8 within the hole 5, the protection layer 10 has a buried part 10a buried in the depression, as shown in FIG. 2B.

The thickness of the protection layer 10 may be set to be 0.05 $\mu$m to 0.2 $\mu$m. If it is less than 0.05 $\mu$m, no satisfactory protection function is obtained. If it is greater than 0.2 $\mu$m, the necessary time for the CMP process is too long.

Instead of TiN, Ti, Si, $SiO_2$ produced by PECVD, $SiN_x$ produced by PECVD, or $SiN_{1-x}O_x$ produced by PECVD may be used as the protection layer 10.

To obtain the planarized surface of the W layer 8 in the via hole 5, a CMP process is performed with the use of a polishing slurry made of a basic mixture. The basic mixture includes hydrogen peroxyde ($H_2O_2$), water ($H_2O$), and abrasive particles of $Al_2O_3$. The concentration of the solid component (i.e., $Al_2O_3$ particles) is 12%, and the ratio of $H_2O_2$ and $H_2O$ is set as $H_2O_2:H_2O=1:1$.

The concentration of the $Al_2O_3$ particles as the solid component may be 5% to 33%. The ratio of $H_2O_2$ and $H_2O$ may be set as $H_2O_2:H_2O=1:1$ to 1:2.

As the oxidizing agent in the polishing slurry, any cyanide such as $K_3Fe(CN)_6$ may be used instead of $H_2O_2$.

Figure 2C:
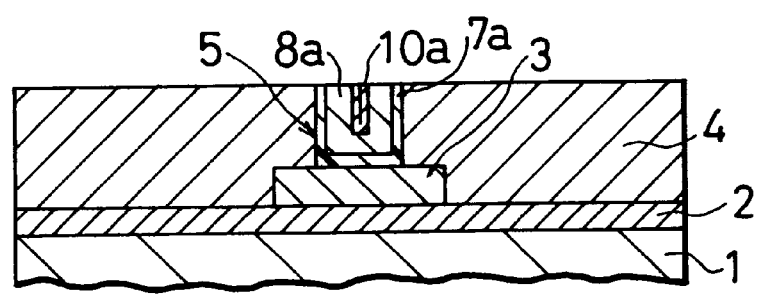

Through the CHP process, the protection layer 10, the conductive layer 8, and the barrier layer 7, which are located outside the via hole 5, are selectively removed, thereby leaving the depressed part 8a of the W layer 8 and the buried part 10a of the TiN protection layer 10 within the via hole 5. The state at this stage is shown in FIG. 2C.

The remaining depressed part 8a of the W layer 8, the remaining part 7a of the Ti/TiN barrier layer 7, and the remaining buried part 10a of the TiN protection layer 10 constitute a conductor plug.

Since the depressed part 8a of the W layer 8 is able to be protected by the buried part 10a of the TiN protection layer 10 during the above CMP process, no void is generated in the depressed part 8a nor the thickness reduction of the part 8a arises within the hole 5.

Figure 2D:
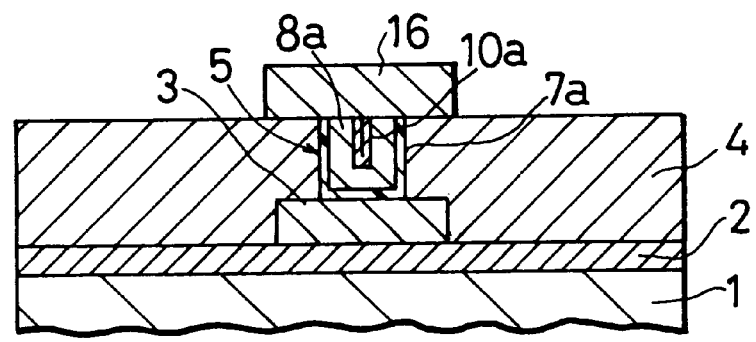

Finally, a second wiring layer 16 is formed on the planarized surface of the second interlevel dielectric layer 4 by a sputtering process, and is then patterned to have the configuration as shown in FIG. 2D The layer 16 is made of an Al—Si—Cu alloy and has a thickness of 0.8 $\mu$m. The layer 16 is contacted with the underlying conductor plug made of the depressed part 8a, the remaining barrier layer 7a, and the buried part 10a. The thickness of the layer 16 may be 0.5 $\mu$m to 1.0 $\mu$m.

Thus, the two-layer wiring structure as shown in FIG. 2D is obtained over the semiconductor substructure 1.

If the process steps as shown in FIGS. 2A to 2D are repeated as necessary, a wanted multilayer wiring structure is able to be realized over the substructure 1.

With the fabrication method according to the first embodiment, the W layer 8 is covered with the protection layer 10 and then, the W layer 8 and the protection layer 10 are polished by the CMP process with the use of the polishing material including the oxidizing agent (i.e., $H_2O_2$). Also, the protection layer 10 has the buried part 10a formed on the first depressed part 8a of the W layer 8 within the via hole 5 after the CMP process.

Therefore, due to the presence of the buried part 10a of the protection layer 10, the depressed part 8a of the W layer 8 is effectively prevented from being chemically etched by the oxidizing agent during the CMP process. This means that no void is generated in the depressed part 8a of the W layer 8, and that the thickness of the remaining depressed part 8a is not decreased.

As a result, the semiconductor device with high reliability is able to be fabricated at a high fabrication yield.

Second Embodiment

FIGS. 3A to 3E show a fabrication method of a semiconductor device according to a second embodiment, which is preferably applicable to the case where the maximum size or diameter of via holes is twice as much as the minimum size or diameter thereof or greater.

First, a first interlevel dielectric layer 2 is formed on a main surface of a substructure 1 by a CVD process. A first wiring layer 3 made of a metal layer with a thickness of 0.5 μm is formed on the first interlevel dielectric layer 2.

Figure 3A:
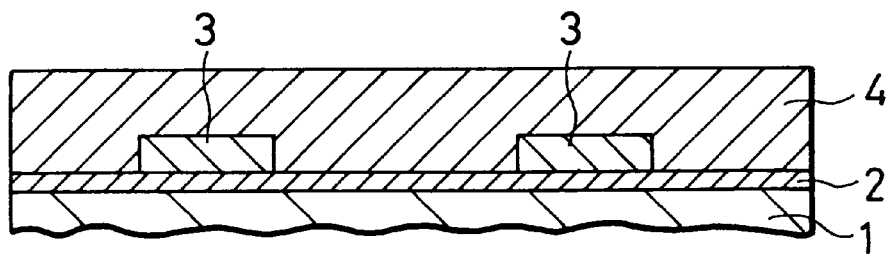
FIGS. 3A to 3E are partial cross-sectional views showing the process steps of a fabrication method of a semiconductor device according to a second embodiment of the invention, respectively

Then, a second interlevel dielectric layer 4 with a thickness of 0.8 μm is formed on the first interlevel dielectric layer 2 to cover the first wiring layer 3 by a CVD process. To planarize the surface of the second interlevel dielectric layer 4, the layer 4 is subjected to a popular CMP process. The state at this stage is shown in FIG. 3A.

The above process steps are the same as those in the first embodiment.

Following this, a plurality of via holes are formed in the second interlevel dielectric layer 4 at different locations by a popular lithography and etching processes to expose the top of the first wiring layer 3. However, only two holes 5a and 5b are explained here for the sake of simplification of description. The smaller hole 5a has the minimum diameter and the larger hole 5b has the maximum diameter among the plurality of via holes.

Two viaholes 5a and 5b are formed in the second interlevel dielectric layer 4 by popular lithography and etching processes to expose the top of the lower wiring layer 3 at different locations.

A first barrier layer 7 is formed on the second interlevel dielectric layer 4. The layer 7 is contacted with the surface of the layer 4 outside the via holes 5a and 5b, and is contacted with the top of the first wiring layer 3 and with the side wall of the layer 4 inside the via holes 5a and 5b.

The barrier layer 7 has a two-layer structure made of a lower Ti sublayer with a thickness of 0.1 μm and an upper TiN sublayer with a thickness of 0.06 μm. These two sublayers are produced by sputtering processes, respectively. The total thickness of the Ti/TiN barrier layer 7 is 0.16 μm.

The barrier layer 7 has the same configuration as that of the first embodiment.

A first blanket w layer 8 is formed on the barrier layer 7 by a CVD process. The W layer 8 has a thickness equal to (⅓) of the diameter of the via hole 5a.

Figure 3B:
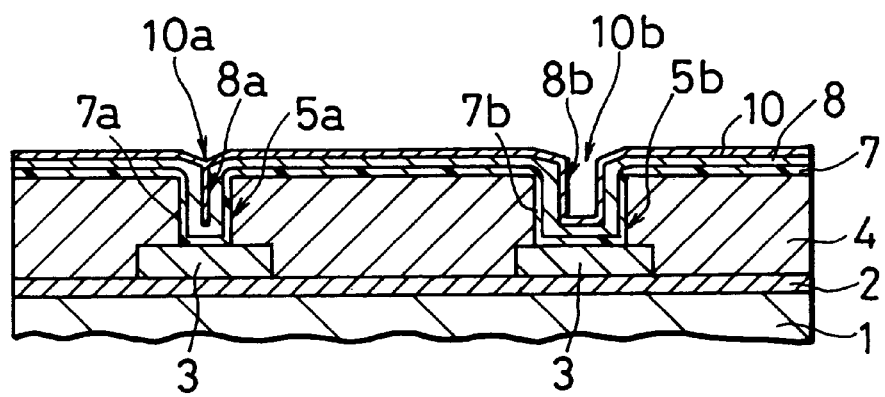

As shown in FIG. 3B, the first W layer 8 has a depressed part 8a in the hole 5a and a depressed part 8b in the hole 5b. Each of the parts 8a and 8b has a cross section like a U character according to the configuration of the holes 5a and 5b, respectively.

The thickness of the first W layer 8 is determined so that the entire hole 5a is not filled with the layer 8. In other words, it is determined so that a depression is formed on the layer 8 within the via hole 5a.

The thickness of the first W layer 8 may be set to be equal to (⅓) to (⅔) of the diameter of the (minimum) via hole 5. The first W layer 8 has the same configuration as the W layer of the first embodiment.

Subsequently, a first protection layer 10 made of a TiN layer with a thickness of 0.1 μm is formed on the first blanket W layer 8. Since the depressions are formed on the W layer 8 within the holes 5a and 5b, respectively, the protection layer 10 has buried parts 10a and 10b buried in the corresponding depressions, as shown in FIG. 3B.

A second blanket W layer 12 is then formed on the first protection layer 10 by a CVD process. The second W layer 12 has a thickness equal to (⅖) of the diameter of the larger via hole 5b.

The thickness of the second W layer 12 may be set to be equal to (⅕) to (9/20) of the diameter of the (maximum) via hole 5b. If it is less than (⅕) of the diameter of the via hole 5b, no satisfactory action as a contact region is obtained. If it is greater than (9/20) of the diameter of the via hole 5b, the buried part 10a of the protection layer 10 is not formed in the via hole 5b.

Figure 3C:
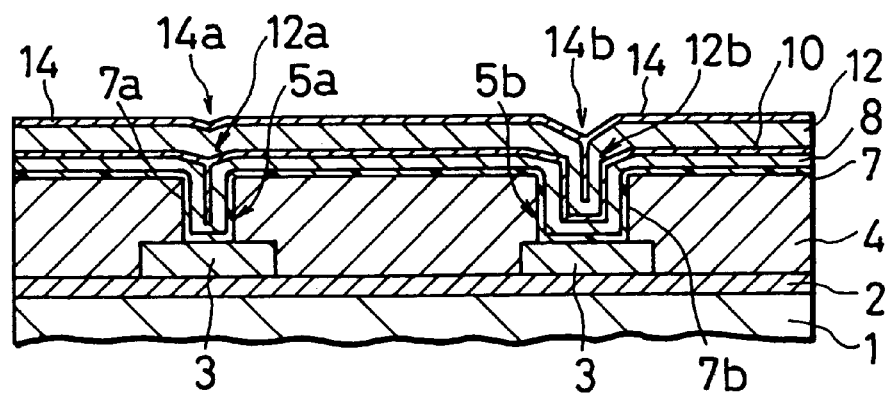
Figure 3D:
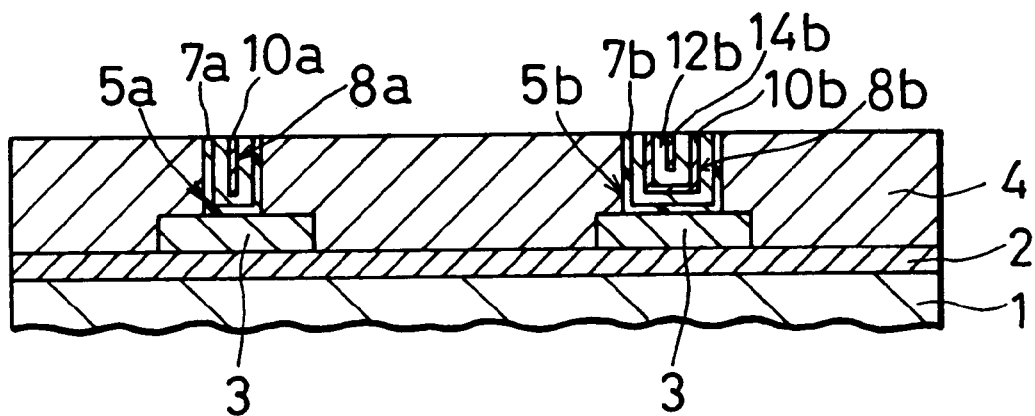

As shown in FIG. 3C, the second W layer 12 has a depressed part 12a right over the hole 5a and a depressed part 12b in the hole 5b. The part 12a has a concave cross section and the part 12b has a cross section like a U character, both of which are according to the configuration of the holes 5a and 5b.

The thickness of the second w layer 12 is determined so that the entire hole 5b is not filled with the layer 12. In other words, it is determined so that a depression is formed on the layer 12 within the via hole 5b.

Subsequently, a second protection layer 14 made of a TiN layer with a thickness of 0.1 μm is formed on the second blanket W layer 12. Since the depressions are formed on the W layer 12 within the holes 5a and 5b, respectively, the second protection layer 14 has buried parts 14a and 14b buried in the corresponding depressions, as shown in FIG. 3C.

To obtain the planarized surface of the first W layer 8 in the via holes 5a and 5b, a CMP process is performed with the use of the same polishing slurry as that in the first embodiment.

Through the CMP process, the barrier layer 7, the first conductive layer 8, the first protection layer 10, the second protection layer 12, and the second conductive layer 14, which are located outside the via holes 5a and 5b, are selectively removed. Thus, the depressed part 8a of the first W layer 8 and the buried part 10a of the TiN protection layer 10 are left within the smaller via hole 5a. The depressed part 8b of the first W layer 8, the buried part 10b of the TiN protection layer 10, and the depressed part 12b of the second W layer 12 are left within the larger via hole 5b. The state at this stage is shown in FIG. 3C.

The remaining depressed part 8a of the first W layer 8, the remaining part 7a of the first Ti/TiN barrier layer 7, and the remaining buried part 10a of the first TiN protection layer 10 constitute a first conductor plug located in the hole 5a. The remaining part 7b of the first Ti/TiN barrier layer 7, the remaining depressed part 8b of the first w layer 8, the remaining buried part 10b of the first TiN protection layer 10, and the remaining depressed part 12b of the second W layer 12, and the remaining part 14b of the second Ti/TiN barrier layer 14 constitute a second conductor plug located in the hole 5b.

Since the depressed part 8a of the first W layer 8 is able to be protected by the buried part 10a of the first TiN protection layer 10 during the above CMP process, no void is generated in the depressed part 8a nor the thickness reduction of the part 8a arises within the smaller hole 5a. Also, since the depressed part 12a of the second W layer 12 is able to be protected by the buried part 14b of the second TiN protection layer 14 during the above CMP process, no void is generated in the depressed part 8b nor the thickness reduction of the part 8b arises within the larger hole 5b.

Figure 3E:
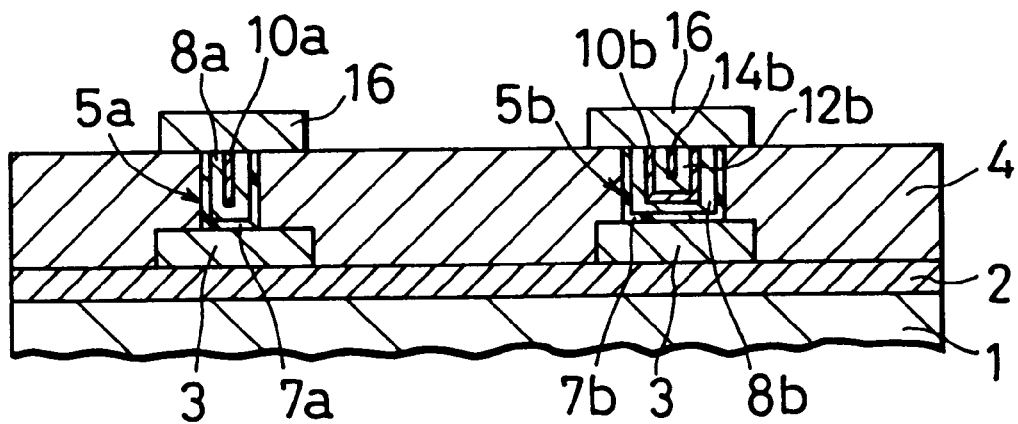

Finally, a second wiring layer 16 is formed on the planarized surface of the second interlevel dielectric layer 4 by a sputtering process and is patterned to have the configuration as shown in FIG. 3E. The thickness of the layer 16 may be 0.5 μm to 1.0 μm.

The second wiring layer 16 is made of an Al—Si—Cu alloy and has a thickness of 0.8 μm. The layer 16 is contacted with the underlying first- conductor plug in the hole 5a and with the underlying second conductor plug in the hole 5b.

Thus, the two-layer wiring structure is obtained over the semiconductor substructure 1.

If the process steps as shown in FIGS. 3A to 3E are repeated as necessary, a wanted multilayer wiring structure is able to be realized over the substructure 1.

In the fabrication method of the semiconductor device according to the second embodiment, the first and second protection layers 10 and 14 are made of TiN. However, the first protection layer 10 may be Ti, and the second protection layer 14 may be Si, $SiO_2$ produced by PECVD, $SiN_x$ produced by PECVD, or $SiN_{1-x}O_x$ produced by PECVD.

The thickness of the first and second protection layers 10 and 14 may be set to be 0.05 μm to 0.2 μm, which is the same as that of the first embodiment. If it is less than 0.05 μm, no satisfactory action as a protection layer is obtained. If it is greater than 0.2 μm, the necessary time for the CMP process is too long.

Thus, a multilevel interconnection structure is produced by repeating the above processes as necessary.

With the fabrication method according to the second embodiment, the first W layer 8 is covered with the first protection layer 10, and then, the second W layer 12 is covered with the second protection layer 14. Then, the first and second W layers 8 and 12 and the first and second protection layers 10 and 14 are polished by the CME process with the use of the polishing material including the oxidizing agent ($H_2O_2$). Also, the first protection layer 10 has the buried part 10a formed on the first depressed part 8a of the first W layer 8 within the via hole 5a. The second protection layer 14 has the buried part 14a formed on the second depressed part 8b of the second W layer 12 within the via hole 5b.

Therefore, due to the presence of the buried parts 10a of the first protection layer 10, the depressed part 8a of the first W layer 8 is effectively prevented from being chemically etched by the oxidizing agent during the CMP process. Similarly, due to the presence of the buried part 14b of the second protection layer 14, the depressed part 8b of the first W layer 8 is effectively prevented from being chemically etched by the oxidizing agent during the CMP process. This means that no void is generated in the depressed part 8a of the first W layer 8 and the depressed part 12b of the second W layer 12, and that the thickness of the depressed parts 8a and 12a is not decreased.

As a result, similar to the first embodiment, the semiconductor device with high reliability is able to be fabricated at a high fabrication yield.

Third Embodiment

FIGS. 4A to 4D show a fabrication method of a semiconductor device according to a third embodiment, which is preferably applicable to the case where some trenches for wiring lines are formed to be stacked on corresponding via holes for contacts.

Figure 4A:
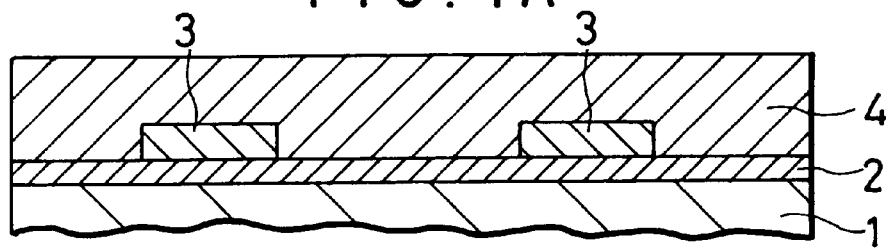
FIGS. 4A to 4D are partial cross-sectional views showing the process steps of a fabrication method of a semiconductor device according to a third embodiment of the invention, respectively.
Figure 4B:
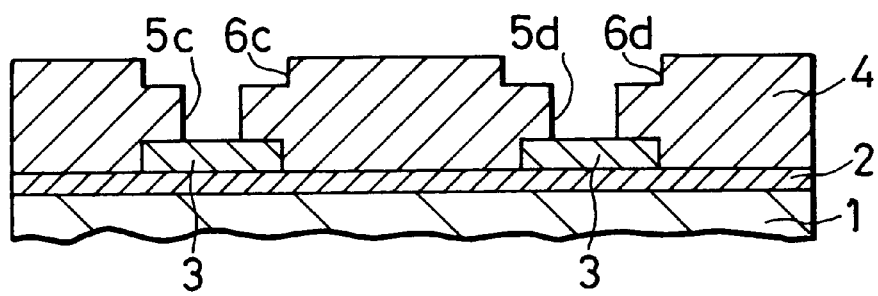

First, in the same way as that of the first embodiment, the second interlevel dielectric layer 4, the first wiring layer 3, and the first interlevel dielectric layer 2 are formed on the main surface of the semiconductor substructure 1, and then, the second interlevel dielectric layer 4 is subjected to a popular CMP process to planarize the surface of the layer 4. The state at this stage is shown in FIG. 4A.

Following this, a plurality of via holes and a plurality of wiring trenches are formed in the upper interlevel dielectric layer 4 at different locations by a popular lithography and etching processes to expose the top of the lower wiring layer 3. However, only two holes 5c and 5d and two wiring trenches 6c and 6d are explained here for the sake of simplification of description. The smaller hole 5c has the minimum diameter among the plurality of via holes. The larger trench 6d has the maximum width among the plurality of wiring trenches.

Two via holes 5c and 5d are formed in the upper interlevel dielectric layer 4 by a popular lithography and etching processes to expose the top of the lower wiring layer 3 at different locations. Two wiring trenches 6c and 6d are formed in the upper interlevel dielectric layer 4 by a popular lithography and etching processes to be stacked with the corresponding holes 5a and 5b, respectively.

Then, a Ti/TiN first barrier layer 7 with a total thickness of 0.16 μm is formed on the second interlevel dielectric layer 4 by sputtering processes. The layer 7 is contacted with the surface of the layer 4 outside the via holes 5c and 5d and wiring trenches 6c and 6d, and is contacted with the top of the first wiring layer 3 and with the side wall of the layer 4 inside the holes 5c and 5d and the trenches 6c and 6d.

The first barrier layer 7 has the same two-layer structure as that of the first embodiment. The preferable thickness of the Ti and TiN sublayers also is the same as that of the first embodiment.

Figure 4C:
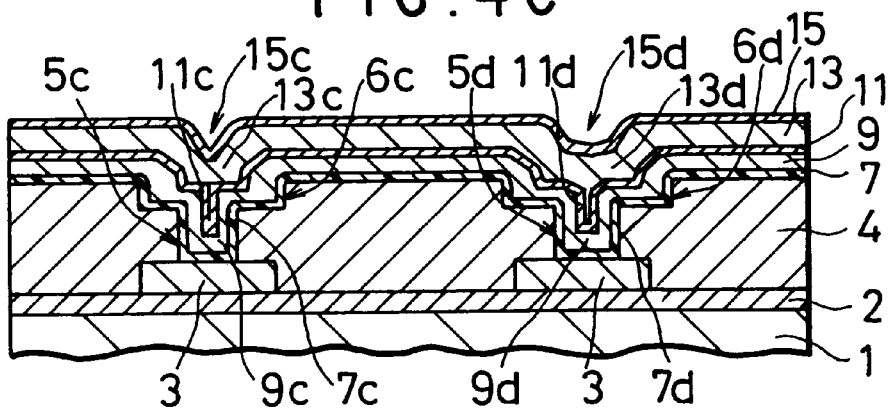

A first copper (Cu) layer 9 is formed on the first barrier layer 7 by a CVD process, as shown in FIG. 4C. The Cu layer 9 has a thickness equal to (⅓) of the diameter of the smaller via hole 5c.

The thickness of the first Cu layer 9 may be set to be equal to (⅕) to (⅔) of the diameter of the (minimum) via hole 5c. If it is less than (⅕) of the diameter of the via hole 5c, no satisfactory action as a contact region is obtained. If it is greater than (⅔) of the diameter of the via hole 5c, the buried part 10c of the first protection layer 10 is not formed in the via hole 5c.

As shown in FIG. 4C, the first Cu layer 9 has a depressed part 9c in the smaller hole 5c and a depressed part 9d in the larger hole 5d. Each of the parts 9c and 9d has a cross section like a U character according to the configuration of the holes 5c and 5d.

The thickness of the first Cu layer 9 is determined so that the entire hole 5c is not filled with the layer 9. In other words, it is determined so that a depression is formed on the layer 9 within the smaller via hole 5c.

Subsequently, a first protection layer 11 made of a Ti layer with a thickness of 0.1 μm is formed on the Cu layer 9. Since the depressions are formed on the first Cu layer 9 within the holes 5c and 5d, respectively, the first protection layer 11 has buried parts 11c and 11d buried in the corresponding depressions, as shown in FIG. 4C.

The thickness of the first protection layer 11 maybe set to be 0.05 μm to 0.2 μm. If it is less than 0.05 μm, no satisfactory protection function is obtained. If it is greater than 0.2 μm, the necessary time for the CMP process is too long.

TiN may be used as the first protection layer 11 instead of Ti.

A second Cu layer 13 is then formed on the first protection layer 11 by a CVD process. The second Cu layer 13 has a thickness equal to (⅓) of the (maximum) width of the wider wiring trench 6d.

The thickness of the second Cu layer 13 may be set to be equal to (⅕) to (9/20) of the width of the (maximum) wiring trench 6d. If it is less than (⅕) of the width of the trench 6d, no satisfactory action as a contact region is obtained. If it is greater than (9/20) of the width of the trench 6d, the buried part 10c of the first protection layer 10 is not formed in the trench 6d.

As shown in FIG. 4C, the second Cu layer 13 has a depressed part 13c right over the hole 5c and a depressed part 13d right over the hole 5d. Each of the parts 13c and 13d has a cross section like a V character, both of which are according to the configuration of the holes 5c and 5d and the trenches 6c and 6d.

The thickness of the second Cu layer 13 is determined so that the entire hole 5d is not filled with the layer 13. In other words, it is determined so that a depression is formed on the layer 13 within the via hole 5d.

Subsequently, a second protection layer 15 made of a Ti layer with a thickness of 0.1 μm is formed on the second Cu layer 13. Since the depressions are formed on the second Cu layer 13 right over the holes 5c and 5d, respectively, the second protection layer 15 has buried parts 15c and 15d buried in the corresponding depressions, as shown in FIG. 4C.

The thickness of the second protection layer 15 may be set to be 0.05 μm to 0.2 μm. If it is less than 0.05 μm, no satisfactory protection function is obtained. If it is greater than 0.2 μm, the necessary time for the CMP process is too long.

TiN may be used as the second protection layer 11 instead of Ti.

To obtain the planarized surface of the first Cu layer 9 in the wiring trenches 6c and 6d, a CMP process is performed with the use of the same polishing slurry as that in the first embodiment.

Through the CMP process, the Ti/TiN barrier layer 7, the Cu first conductive layer 9, the Ti first protection layer 11, the Cu second conductive layer 13, and the Ti second protection layer 15, which are located outside the via holes 5c and 5d and the wiring trenches 6c arid 6d, are selectively removed.

Figure 4D:
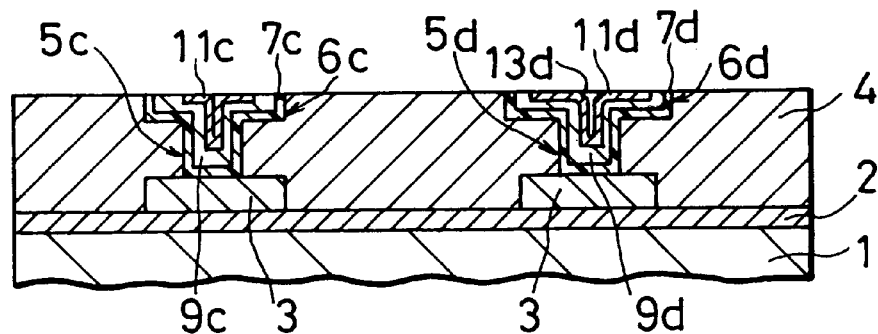

Thus, the depressed part 7c of the Ti barrier layer 7, the depressed part 9c of the first Cu layer 9, and the buried part 11c of the Ti protection layer 11 are left within the smaller via hole 5c and the narrower wiring trench 6c. The depressed part 7d of the Ti barrier layer 7, the depressed part 9d of the first Cu layer 9, and the buried part 11b of the Ti protection layer 11 are left within the larger via hole 5d and the wider wiring trench 6d. The state at this stage is shown in FIG. 4D.

The remaining part 7c of the first barrier layer 7, the remaining depressed part 9c of the first Cu layer 9, and the remaining buried part 11c of the first protection layer 11 constitute a first conductor plug located in the hole 5c and a wiring line located in the trench 6c. The remaining part 7d of the first barrier layer 7, the remaining depressed part 9d of the first Cu layer 9, the remaining buried part 11c of the first protection layer 11, and the remaining depressed part 13d of the second Cu layer 13 constitute another conductor plug located in the hole 5d and another wiring line located in the trench 6d.

Since the depressed part 9c of the first Cu layer 9 is able to be protected by the buried part 11c of the first TiN protection layer 11 during the above CMP process, no void is generated in the depressed part 9c nor thickness reduction of the part 9c arises within the smaller hole 5c and the narrower trench 6c. Also, since the depressed part 9d of the first Cu layer 9 is able to be protected by the buried part 11d of the first Ti protection layer 11 during the above CMP process, no void is generated in the depressed part 9d nor thickness reduction of the part 9d arises within the larger hole 5d and the wider trench 6d.

Thus, the wiring structure stacked with the underlying contact regions is obtained over the semiconductor substructure 1.

If the process steps as shown in FIGS. 4A to 4D are repeated as necessary, a wanted multilayer wiring structure is able to be realized over the substructure 1.

With the fabrication method of the semiconductor device according to the third embodiment, the same advantage as that of the first embodiment is obtained due to the same reason as that of the second embodiment.

Also, an additional advantage that the contact regions and the wiring lines are simultaneously formed is obtained.

Although Cu is used for the first and second conductive layers 9 and 13 in the third embodiment, Al, Al alloy, or W may be used instead of Cu. These materials may be produced by CVD, sputtering, or evaporation.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device, comprising:

(a) preparing a semiconductor substructure;

(b) forming a first interlevel dielectric layer on said semiconductor substructure;

(c) forming a first wiring layer on said first interlevel dielectric layer; (d) forming a second interlevel dielectric layer on said first interlevel dielectric layer to cover said first wiring layer;

(e) forming a first opening in said second interlevel dielectric layer to expose the top of said first wiring layer;

(f) forming a first conductive layer on said second interlevel dielectric layer to cover said first opening, said first conductive layer having a first concave part located in said first opening according to the configuration of said first opening;

(g) forming a first protection layer on said first conductive layer to cover said first concave part of said first conductive layer, said first protection layer having a first buried part located on said first concave part of said first conductive layer;

(h) polishing said first protection layer and said first conductive layer until said second interlevel dielectric layer is exposed, thereby selectively leaving said first concave part of said first conductive layer within said first opening;

wherein said first concave part left within said first opening constitutes a first conductor plug for electrically interconnecting said first wiring layer with a second wiring layer which is formed to contact said first conductor plug; and forming a plurality of openings in said second interlevel dielectric layer;

wherein said first opening has a minimum diameter size among said first opening and said plurality of openings; and wherein said first conductive layer has a thickness equal to (⅕) to (⅖) of said minimum diameter size of said first opening.

2. A fabrication method of a semiconductor device, comprising;

(a) preparing a semiconductor substructure;

(b) forming a first interlevel dielectric layer on said semiconductor substructure;

(c) forming a first wiring layer on said first interlevel dielectric layer;

(d) forming a second interlevel dielectric layer on said first interlevel dielectric layer to cover said first wiring layer;

(e) forming a first opening in said second interlevel dielectric layer to expose the top of said first wiring layer;

(f) forming a first conductive layer on said second interlevel dielectric layer to cover said first opening, said first conductive layer having a first concave part located in said first opening according to the configuration of said first opening;

(g) forming a first protection layer on said first conductive layer to cover said first concave part of said first conductive layer, said first protection layer having a first buried part located on said first concave part of said first conductive layer;

(h) polishing said first protection layer and said first conductive layer until said second interlevel dielectric layer is exposed, thereby selectively leaving said first concave part of said first conductive layer within said first opening;

wherein said first concave part left within said first opening constitutes a first conductor plug for electrically interconnecting said first wiring layer with a second wiring layer which is formed to contact said first conductor plug;

wherein said first opening has a lower part serving as a via hole and an upper part serving as a wiring trench communicated with said via hole.

3. A fabrication method of a semiconductor device, comprising:

(a) preparing a semiconductor substructure;

(b) forming a first interlevel dielectric layer on said semiconductor substructure;

(c) forming a first wiring layer on said first interlevel dielectric layer;

(d) forming a second interlevel dielectric layer on said first interlevel dielectric layer to cover said first wiring layer;

(e) forming a first opening in said second interlevel dielectric layer to expose the top of said first wiring layer;

(f) forming a first conductive layer on said second interlevel dielectric layer to cover said first opening, said first conductive layer having a first concave part located in said first opening according to the configuration of said first opening;

(g) forming a first protection layer on said first conductive layer to cover said first concave part of said first conductive layer, said first protection layer having a first buried part located on said first concave part of said first conductive layer;

(h) polishing said first protection layer and said first conductive layer until said second interlevel dielectric layer is exposed, thereby selectively leaving said first concave part of said first conductive layer within said first opening;

wherein said first concave part left within said first opening constitutes a first conductor plug for electrically interconnecting said first wiring layer with a second wiring layer which is formed to contact said first conductor plug;

wherein a second opening is formed in said second interlevel dielectric layer to expose the top of said first wiring layer at a different location from that of said first opening; and wherein said second opening has a larger diameter size than that of said first opening; said method further comprising:

forming a second conductive layer on said first protection layer, said second conductive layer having a second concave part located in said second opening according to the configuration of said second opening;

forming a second protection layer on said second conductive layer, said second protection layer having a second buried part located on said second concave part of said second conductive layer;

wherein said second protection layer, said second conductive layer, said first protection layer, said first conductive layer are polished, thereby selectively leaving said second concave part of said second conductive layer and said second buried part of said second protection layer within said second opening;

and wherein said second concave part and said second buried part of said second protection layer left within said second opening constitute a second conductor plug for electrically interconnecting said first wiring layer with said second wiring layer.

4. A fabrication method of a semiconductor device, comprising.

(a) preparing a semiconductor substructure;

(b) forming a first interlevel dielectric layer on said substructure;

(c) forming a first wiring layer on said first interlevel dielectric layer;

(d) forming a second interlevel dielectric layer on said first interlevel dielectric layer to cover said first wiring layer;

(e) forming a first opening and a second opening in said second interlevel dielectric layer to expose the top of said first wiring layer at different locations, said second opening having a larger diameter than said first opening;

(f) forming a first conductive layer on said second interlevel dielectric layer to cover said first and second openings, said first conductive layer having a first concave part located in said first opening according to the configuration of said first opening and a second concave part located in said second opening according to the configuration of said second opening;

(g) forming a first protection layer on said first conductive layer to cover said first and second concave parts of said first conductive layer, said first protection layer having a first buried part located on said first concave part of said first conductive layer, and a second buried part located on said second concave part of said first conductive layer;

(h) forming a second conductive layer on said first protection layer to cover said first and second openings, said second conductive layer having a third concave part located over said first opening and a fourth concave part located over said second opening;

(i) forming a second protection layer on said second conductive layer to cover said third and fourth concave parts of said second conductive layer, said second protection layer having a third buried part located on said third concave part of said second conductive layer, and a fourth buried part located on said fourth concave part of said second conductive layer; and (j) polishing said second protection layer, said second conductive layer, said first protection layer, and said first conductive layer until said second interlevel dielectric layer is exposed, thereby selectively leaving said first concave part of said first conductive layer within said first opening, and said second concave part of said first conductive layer and said fourth concave part of said second conductive layer within said second opening;

wherein said first concave part left within said first opening constitutes a first conductor plug for electrically interconnecting said first wiring layer with a second wiring layer which is formed to contact said first conductor plug; and wherein said second concave part of said first conductive layer and said fourth concave part of said second conductive layer left within said second opening constitute a second conductor plug for electrically interconnecting said first wiring layer with said second wiring layer.

5. A method as claimed in claim 4, wherein said first opening has a first diameter and said second opening has a second diameter which is larger than said first diameter; and wherein said first conductive layer has a thickness equal to (1/5) to (2/5) of the diameter of said first opening; and wherein said second conductive layer has a thickness equal to (1/5) to (9/20) of the diameter of said second opening.

6. A method as claimed in claim 4, wherein said first conductive layer is made of at least one selected from the group consisting of tungsten, aluminum, aluminum alloy, and copper;

and wherein said first conductive layer is formed by at least one selected from the group consisting of chemical vapor deposition, chemical evaporation, and sputtering.

7. A method as claimed in claim 4, wherein each of said first and second protection layers is made of at least one selected from the group consisting of titanium nitride, titanium, silicon, silicon dioxide produced by plasma-enhanced CVD, silicon nitride produced by plasma-enhanced CVD, and silicon oxynitride produced by plasma-enhanced CVD.

8. A method as claimed in claim 4, wherein said chemical/mechanical polishing process is performed by the use of a slurry including an abrasive material and an oxidizing agent for said first and second conductive layers;

said abrasive material includes abrasive particles made of at least one selected from the group consisting of silica, alumina, cerium, and silicon oxynitride.

9. A method as claimed in claim 4, further comprising the step of forming a first barrier layer on said second interlevel dielectric layer to cover said first and second openings;

wherein said first conductive layer is formed on said first barrier layer.

10. A method as claimed in claim 4, wherein at least one of said first and second openings has a lower part serving as a via hole and an upper part serving as a wiring trench communicated with said via hole.

11. A fabrication method of a semiconductor device, comprising:

(a) preparing a semiconductor substrate;

(b) forming a first conductor on said semiconductor substrate;

(c) forming a first dielectric layer on said semiconductor substrate to cover said first conductor;

(d) forming a first opening in said first dielectric layer to expose the top of said first conductor;

(e) forming a second conductor on said first dielectric layer to cover said first opening, said second conductor having a first concave part located in said first opening according to the configuration of said first opening;

(f) forming a first protection layer on said second conductor to cover said first concave part of said second conductor, said first protection layer having a first buried part located on said first concave part of said second conductor;

(g) removing said first protection layer and said second conductor until said first dielectric layer is exposed, thereby selectively leaving said first concave part of said second conductor within said first opening;

wherein said first concave part left within said first opening constitutes a first conductor plug for electrically interconnecting said first conductor with a third conductor which is formed to contact said first conductor plug;

wherein a second opening is formed in said first dielectric layer to expose the top of said first conductor at a different location from that of said first opening; and wherein said second opening has a larger diameter size than that of said first opening; said method further comprising:

forming a conductive layer on said first protection layer, said conductive layer having a second concave part located in said second opening according to the configuration of said second opening;

forming a second protection layer on said conductive layer, said second protection layer having a second buried part located on said second concave part of said conductive layer;

wherein said second protection layer, said conductive layer, said first protection layer, said first conductor are removed, thereby selectively leaving said second concave part of said conductive layer and said second buried part of said second protection layer within said second opening;

and wherein said second concave part and said second buried part of said second protection layer left within said second opening constitute a second conductor plug for electrically interconnecting said first conductor with said third conductor.

* * * * *